(12) United States Patent
Ando

(10) Patent No.: US 9,960,700 B2
(45) Date of Patent: May 1, 2018

(54) ELECTRONIC APPARATUS

(71) Applicant: DENSO CORPORATION, Kariya, Aichi-pref. (JP)

(72) Inventor: Keiichi Ando, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days. days.

(21) Appl. No.: 15/360,035

(22) Filed: Nov. 23, 2016

(65) Prior Publication Data

US 2017/0149349 A1 May 25, 2017

(30) Foreign Application Priority Data

Nov. 23, 2015 (JP) ................................. 2015-228262

(51) Int. Cl.

| H05K 1/14 | (2006.01) |
| H02M 7/00 | (2006.01) |
| H02M 3/335 | (2006.01) |
| H05K 5/03 | (2006.01) |
| H05K 5/02 | (2006.01) |
| H05K 7/02 | (2006.01) |

(52) U.S. Cl.
CPC ........ *H02M 7/003* (2013.01); *H02M 3/33507* (2013.01); *H05K 5/0247* (2013.01); *H05K 5/03* (2013.01); *H05K 7/026* (2013.01)

(58) Field of Classification Search
CPC ........ H05K 5/0247; H05K 5/03; H05K 7/026; H02M 7/003; H02M 3/33507
USPC ...................................................... 361/738
See application file for complete search history.

(56) References Cited

U.S. PATENT DOCUMENTS

| 4,563,659 A * | 1/1986 | Sakamoto | ............ H03H 1/0007 |
| | | | 333/181 |
| 6,144,571 A * | 11/2000 | Sasaki | ................... H01L 25/162 |
| | | | 257/687 |
| 8,154,380 B2 * | 4/2012 | Miller | ................ B60L 11/1811 |
| | | | 324/718 |
| 2014/0233282 A1 * | 8/2014 | Ohoka | .................... H02M 1/14 |
| | | | 363/39 |
| 2016/0148745 A1 | 5/2016 | Tanimizu et al. | |

FOREIGN PATENT DOCUMENTS

| JP | 2000-049042 A | 2/2000 |
| JP | 2014-176246 A | 9/2014 |

* cited by examiner

*Primary Examiner* — Hung S Bui
(74) *Attorney, Agent, or Firm* — Oliff PLC

(57) ABSTRACT

In an electronic apparatus, a case houses an electronic apparatus main body and is electrically conductive. A terminal block is attached to a case wall of the case. In the terminal block, a main body portion is composed of an insulating material. An external terminal is inserted into a through-hole formed in the case wall, and is connected to the electronic apparatus main body. A capacitor is disposed inside the main body portion. An elastic member is disposed inside the main body portion, is composed of a conductive material, is interposed at least one of between the capacitor and the external terminal, and between the capacitor and the case wall, and fixes the capacitor inside the main body portion by pressing the capacitor. The capacitor and the elastic member configure a filter circuit that allows a noise current included in the external terminal to flow to the case wall.

14 Claims, 12 Drawing Sheets

ELECTRONIC APPARATUS

CROSS-REFERENCE TO RELATED APPLICATION

This application is based on and claims the benefit of priority from Japanese Patent Application No. 2015-228262, filed Nov. 23, 2015. The entire disclosure of the above application is incorporated herein by reference.

TECHNICAL FIELD

The present disclosure relates to an electronic apparatus including a case and a terminal block, the case housing an electronic apparatus main body, the terminal block being attached to a case wall of the case.

RELATED ART

An electronic apparatus that includes a case and a terminal block is known (refer to JP-A-2015-57806). In the electronic apparatus, the case houses an electronic apparatus main body, such as a direct-current to direct-current (DC-DC) converter. The terminal block is attached to a case wall of the case. The case is composed of metal. The terminal block seals therein a portion of an external terminal. The external terminal is inserted into a through-hole that is formed in the case wall and is connected to the electronic apparatus main body.

A capacitor is disposed inside of the terminal block. A noise current present in the external terminal is sent to the case wall via the capacitor. As a result, the noise current is removed from the external terminal. The capacitor is soldered onto a printed board that is disposed inside of the terminal block (see FIG. 13).

A metal collar is attached to the printed board. A bolt is inserted through a hole portion of the collar to fix the terminal block. The collar is pressed against the case wall by the fastening force of the bolt. The capacitor is electrically connected to the case wall through the collar.

However, in this electronic apparatus, stress may be applied to the capacitor inside the terminal block. That is, in the electronic apparatus, the capacitor is soldered onto the printed board. Therefore, the solder may repeatedly expand and contract as a result of heat transmitted from outside and heat generated within the terminal block. Consequently, stress may be applied from the solder to the capacitor, and cracks may form in the capacitor. In addition, the case wall and the terminal block may become bent or warped as a result of the fastening force of the bolt. As a result, stress may be applied to the capacitor and the solder, and cracks may form therein.

Furthermore, in the electronic apparatus, the printed board is disposed inside the terminal block. Therefore, the number of components increases, and manufacturing cost of the terminal block easily increases. Moreover, the soldering process also adds cost, thereby further increasing the manufacturing cost of the terminal block.

In the electronic apparatus, the printed board is warped by the fastening force of the bolt. Due to warping of the printed board, stress is applied to the capacitor and the solder. In order to suppress stress applied to the capacitor and the solder, the capacitor is required to be sufficiently separated from the bolt. As described above, the noise current is transmitted from the capacitor to the case wall, through the collar and the bolt. Therefore, the more the distance between the capacitor and the bolt increases, the longer the path of the noise current becomes. Thus, parasitic inductance easily occurs, thereby being likely to reduce the noise removal effect.

In this way, when the capacitor is fixed to a printed board, the capacitor is required to be disposed in a section that is little affected by warping of the printed board. Therefore, the path of the noise current tends to become long.

SUMMARY

It is thus desired to provide an electronic apparatus in which stress applied to a capacitor inside a terminal block can be reduced, manufacturing cost can be reduced, and noise reduction effect can be improved.

An exemplary embodiment of the present disclosure provides an electronic apparatus including: a case that houses an electronic apparatus main body and is electrically conductive; and a terminal block that is attached to a case wall of the case. The terminal block includes: a main body portion that is composed of an insulating material; an external terminal that is partially covered by the main body portion, is inserted into a through-hole formed in the case wall, and is connected to the electronic apparatus main body; a capacitor that is disposed inside the main body portion; and an elastic member that is disposed inside the main body portion, the elastic member being composed of a conductive material, interposed at least one of between the capacitor and the external terminal, and between the capacitor and the case wall, and fixing the capacitor inside the main body portion by pressing the capacitor. The capacitor and the elastic member configure a filter circuit that allows a noise current included in the external terminal to flow to the case wall.

In the above-described electronic apparatus, the elastic member that is composed of a conductive material is disposed at least one of between the capacitor and the external terminal, and between the capacitor and the case wall. The elastic member and the capacitor form the filter circuit that allows a noise current included in the external terminal to flow to the case wall.

Therefore, when stress is applied to the capacitor, the elastic member can become elastically deformed and absorb the stress. Consequently, a large amount of stress is no longer easily applied to the capacitor. Cracks and the like are not easily formed in the capacitor. As a result of the elastic member being disposed, the capacitor can be pressed against other conductive members, such as the case wall. Thus, excellent electrical connection between the capacitor and the conductive members can be obtained.

As a result of the above-described configuration being used, use of a printed board and soldering of the capacitor to the printed board are no longer necessary. Therefore, manufacturing cost of the terminal block can be reduced.

As a result of the above-described configuration, the capacitor can be fixed inside the terminal block without use of a printed board. Therefore, a path of a noise current can be easily shortened. Parasitic inductance occurring on the path of the noise current can be reduced. Consequently, the effect of removing the noise current can be improved.

As described above, according to the above-described exemplary embodiment, an electronic apparatus can be disposed in which stress applied to a capacitor inside a terminal block can be reduced, manufacturing cost can be reduced, and noise removal effect can be improved.

DESCRIPTION OF THE EMBODIMENTS

The present disclosure will hereinafter be described in detail according to some embodiments. In the embodiments, an electronic apparatus includes a case and a terminal block The case houses an electronic apparatus main body and is electrically conductive. The terminal block is attached to a case wall of the case. In one embodiment, the electronic apparatus main body may be a DC-DC converter. Specifically, the electronic apparatus main body may be an on-board DC-DC converter that is to be mounted in a vehicle such as an automobile.

First Embodiment

Figure 1:
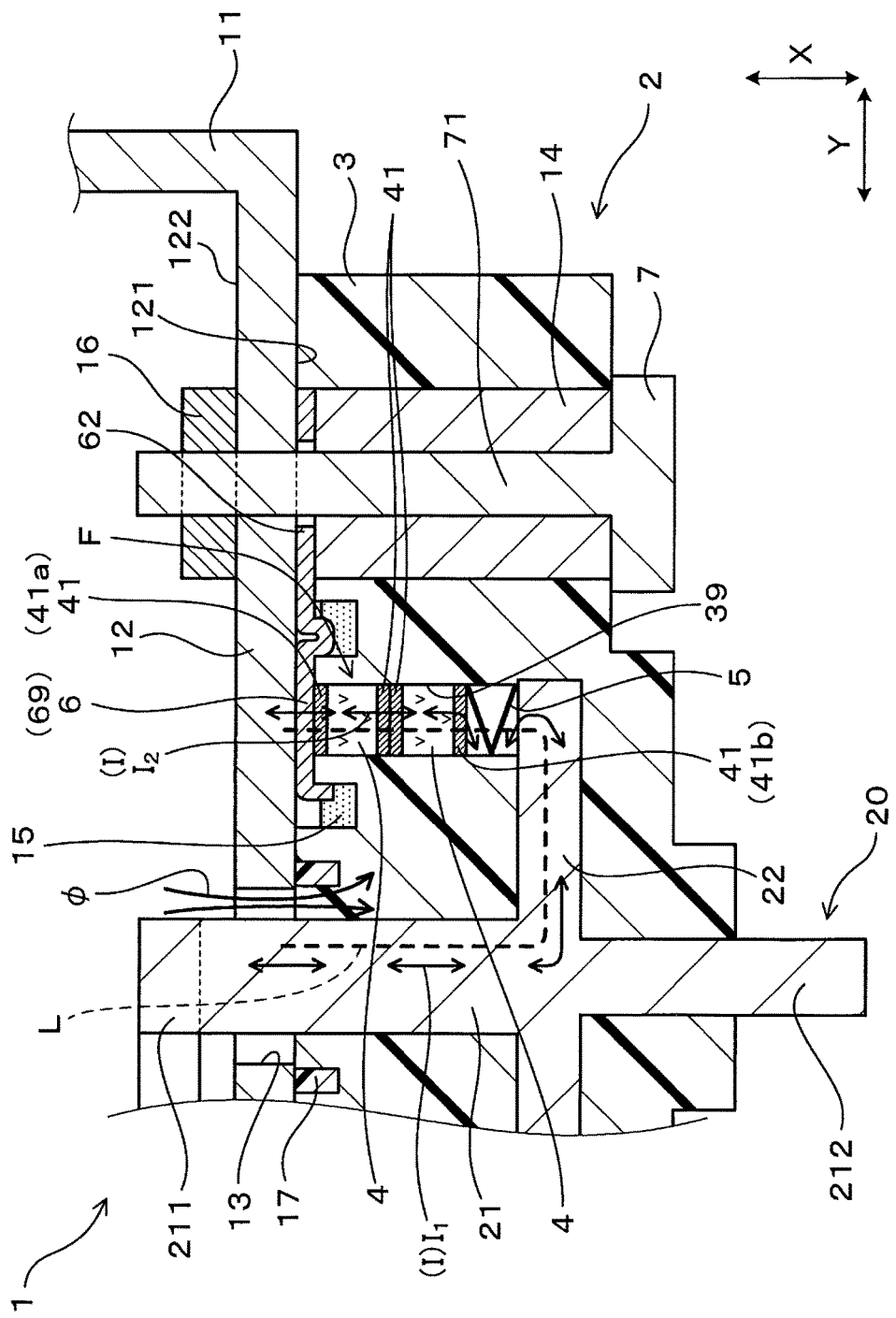
FIG. 1 is an enlarged cross-sectional view of a main section of a terminal block according to a first embodiment.
Figure 2:
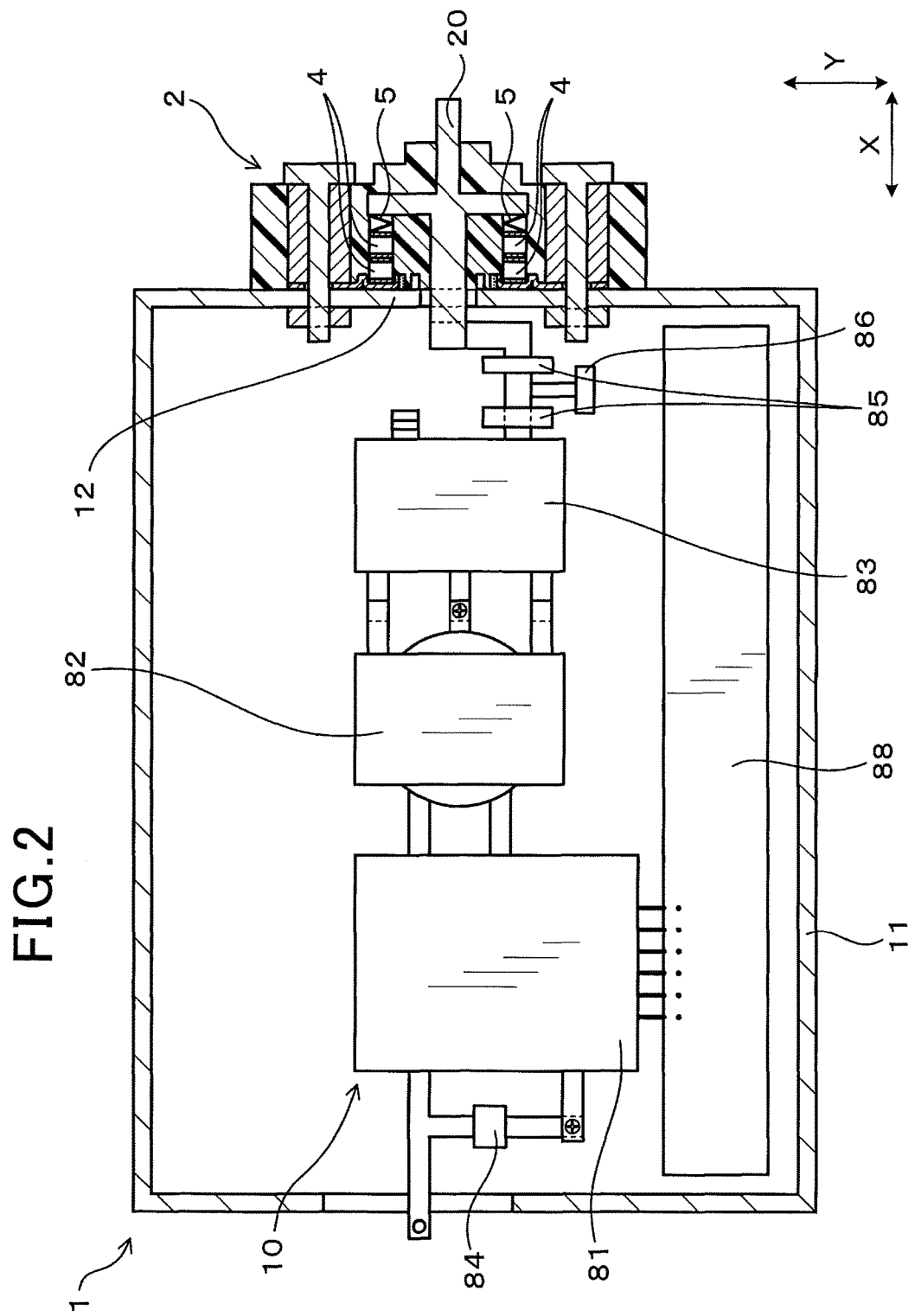
FIG. 2 is a cross-sectional view of an electronic apparatus according to the first embodiment.

An electronic apparatus including a case and a terminal block according to a first embodiment will be described with reference to FIGS. 1 to 7. As shown in FIG. 2, an electronic apparatus 1 according to the present embodiment includes a case 11 and a terminal block 2. The case 11 houses an electronic apparatus main body 10 therein and is electrically conductive. The terminal block 2 is attached to a case wall 12 of the case 11. As shown in FIG. 1, the terminal block 2 includes a main body portion 3, an external terminal 20, a capacitor 4, and an elastic member 5.

The main body portion 3 is composed of an insulating material. The main body portion 3 is attached to an outer case surface 121 of the case wall 12. In addition, the case 11 is grounded. The main body portion 3 seals therein a portion of the external terminal 20. The external terminal 20 is inserted into a through-hole 13 that is formed in the case wall 12 and is connected to the electronic apparatus main body 10.

The capacitor 4 is disposed inside the main body portion 3.

The elastic member 5 is disposed inside the main body portion 3. The elastic member 5 is composed of a conductive material. According to the present embodiment, the elastic member 5 is disposed between the capacitor 4 and the external terminal 20. The elastic member 5 presses the capacitor 4. As a result, the capacitor 4 is fixed inside the main body portion 3.

The capacitor 4 and the elastic member 5 configure a filter circuit F that allows a noise current I included in the external terminal 20 to flow to the case wall 12.

The electronic apparatus main body 10 is a DC-DC converter. More specifically, the electronic apparatus main body 10 is an on-board DC-DC converter that is mounted in a vehicle, such as an electric vehicle or a hybrid vehicle. As described hereafter, the DC-DC converter is configured to lower the voltage of a high-voltage battery that is mounted in the vehicle and charge a low-voltage battery.

Figure 7:
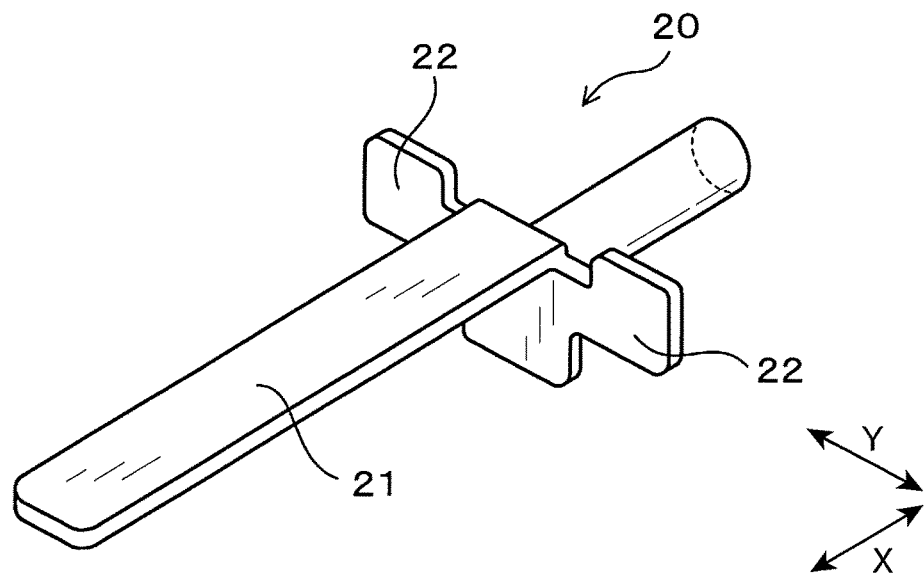
FIG. 7 is a perspective view of an external terminal.

As shown in FIGS. 1 and 7, the external terminal 20 according to the present embodiment includes a main terminal body 21 and a projecting portion 22. The main terminal body 21 extends in a thickness direction (hereinafter referred to as "X direction") of the case wall 12. The projecting portion 22 projects from the main terminal body 21 in a direction ((hereinafter referred to as "Y direction") perpendicular to the X direction.

As shown in FIG. 1, the capacitor 4 and the elastic member 5 are disposed in a position adjacent to the main terminal body 21. The capacitor 4 and the elastic member 5 are interposed between the projecting portion 22 and the case wall 12. In addition, the capacitor 4 and the elastic member 5 overlap each other in the X direction. Electrodes 41 of the capacitor 4 are formed on both ends of the capacitor 4 in the X direction.

The case 11 and the elastic member 5 are composed of metal. According to the present embodiment, a leaf spring is used as the elastic member 5. In addition, the capacitor 4 is a so-called chip capacitor. More specifically, the capacitor 4 is a laminated ceramic capacitor.

When the electronic apparatus main body 10 is operated, the external terminal 20 outputs a direct current. The direct current includes the noise current I. The noise current I is transmitted from the external terminal 20 to the case wall 12, through the elastic member 5, the capacitor 4, and a waterproof cover 6 that is described hereafter.

As shown in FIG. 1, according to the present embodiment, two capacitors 4 are connected in series. The electrodes 41 of the two capacitors 4 are in contact with each other.

In other words, a conductive member, such as solder, is not interposed between the electrodes 41 of the two capacitors 4.

Figure 3:
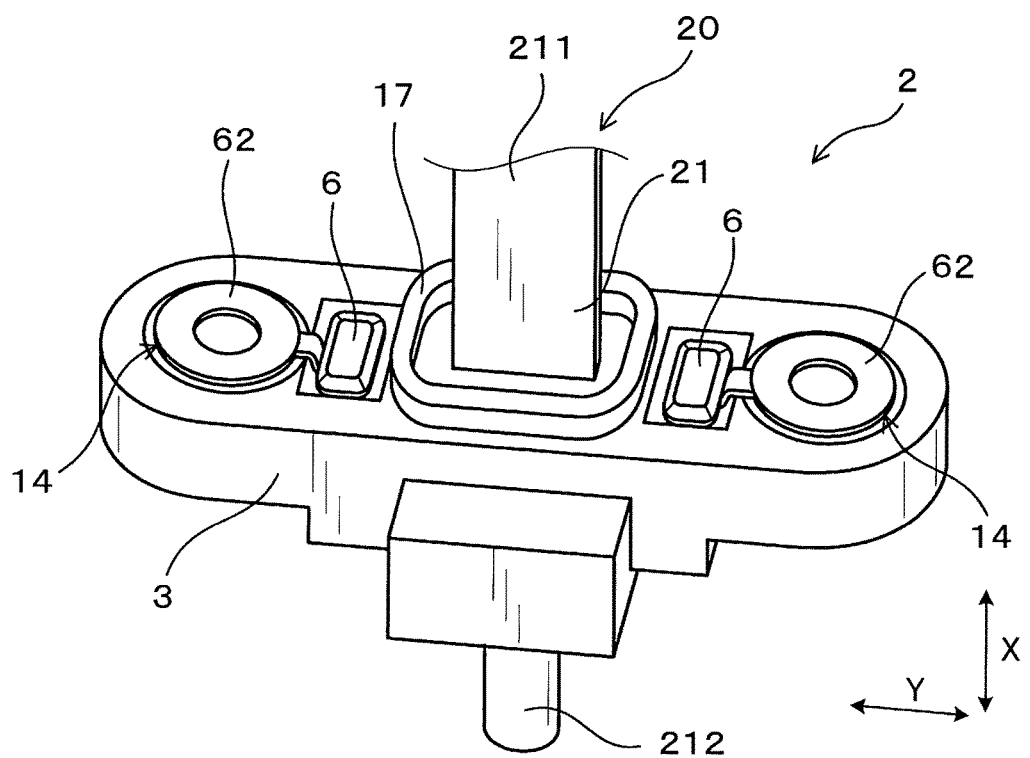
FIG. 3 is a perspective view of the terminal block according to the first embodiment, viewed from an inner side of a case.

As shown in FIG. 1 and FIG. 3, the waterproof cover 6 is interposed between the capacitor 4 and the case wall 12. The waterproof cover 6 is composed of metal. The noise current I is transmitted to the case wall 12 through the waterproof cover 6.

As shown in FIG. 1, the terminal block 2 is fixed to the case wall 12 by a male screw 7 (e.g., bolt). A female screw 16 (e.g., nut) is disposed inside the case 11. The female screw 16 is screwed onto the male screw 7. A cylindrical collar 14 is disposed in the main body portion 3. The collar 14 surrounds an axial portion 71 of the male screw 7. The collar 14 receives the fastening force of the male screw 7. The collar 14 is composed of metal. The main body portion 3 is composed of resin. As a result of the collar 14 being provided, a problem in which the main body portion 3 receives the fastening force of the male screw 7 and becomes depressed is suppressed.

Figure 5:
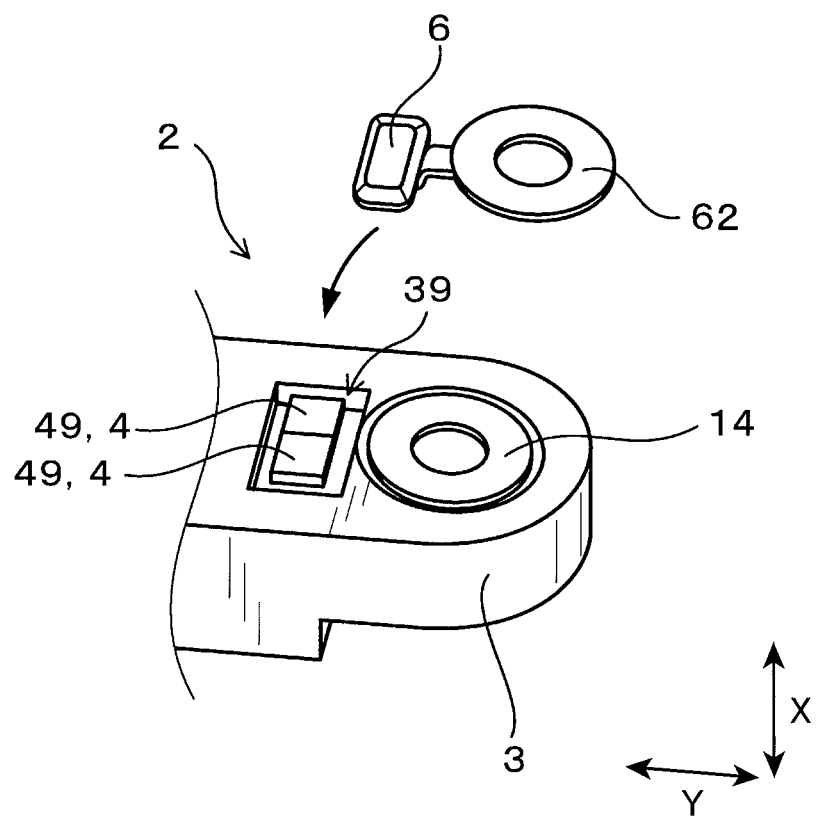
FIG. 5 is a perspective view of the terminal block according to the first embodiment, in a state in which a waterproof cover is removed.

As shown in FIGS. 1 and 5, a portion of the waterproof cover 6 extends towards the collar 14 side. The extending portion (hereinafter referred to as "extension portion 62") is interposed between the collar 14 and the case 12.

As shown in FIG. 1, a housing recess portion 39 is formed in the main body portion 3. The housing recess portion 39 houses the capacitors 4 and the elastic member 5. When the terminal block 2 is manufactured, the elastic member 5 and the capacitors 4 are housed in the housing recess portion 39. The waterproof cover 6 is then attached as shown in FIG. 5. The waterproof cover 6 is subsequently fixed to the main body portion 3 using an adhesive 15 (see FIG. 1).

As shown in FIG. 5, according to the present embodiment, two sets of capacitor pairs 49 are housed in the housing recess portion 39. Each capacitor pair 49 is composed of two capacitors 4 that are connected to each other in series. That is, a total of four capacitors 4 are housed in the housing recess portion 39. The two sets of capacitor pairs 49 are connected to each other in parallel.

As shown in FIGS. 1 and 3, an annular sealing member 17 is disposed in the main body portion 3. The sealing member 17 seals the through-hole 13. The sealing member 17 surrounds the main terminal body 21. The waterproof cover 6 is disposed on the outer side of the sealing member 17. The sealing member 17 suppresses infiltration of water into the through-hole 13.

Figure 4:
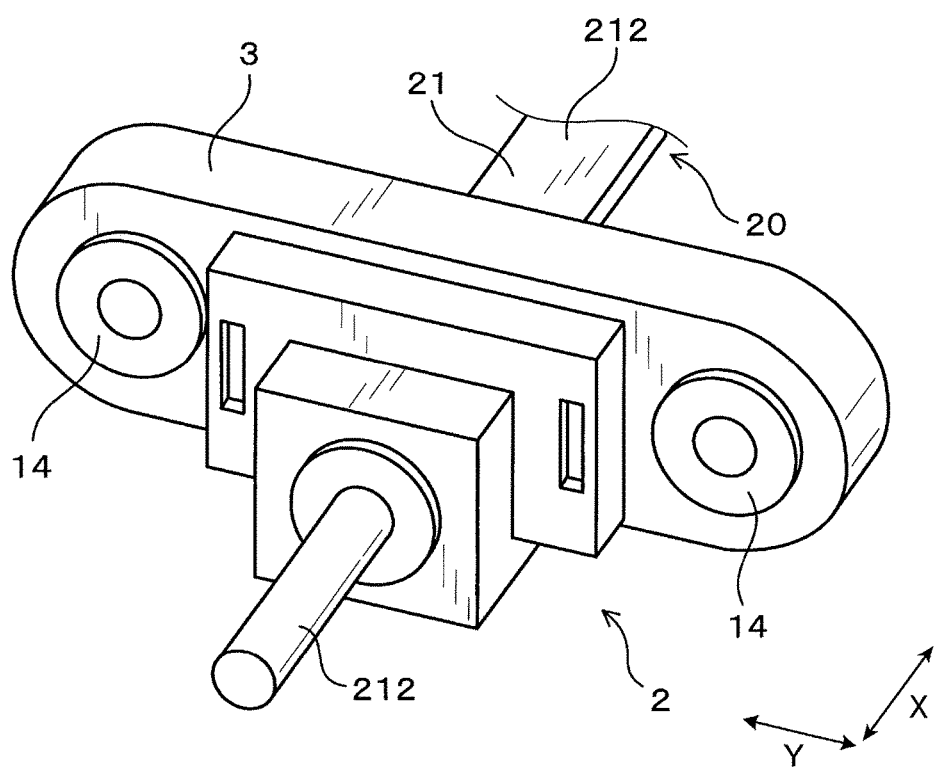
FIG. 4 is a perspective view of the terminal block according to the first embodiment, viewed from an outer side of the case.

As shown in FIGS. 3, 4, and 7, the main terminal body 21 includes an inner portion 211 and an outer portion 212. The inner portion 211 is disposed inside of the case 11. The outer portion 212 is disposed outside of the case 11 and exposed from the main body portion 3. The inner portion 211 is formed into a plate-like shape. The inner portion 211 is connected to the electronic apparatus main body 10 (i.e., DC-DC converter). The outer portion 212 is formed into a circular column. A wire harness or the like (not shown) is connected to the outer portion 212.

As shown in FIG. 7, the external terminal 20 has two projecting portions 22. Each projecting portion 22 is formed into a plate-like shape.

Figure 6:
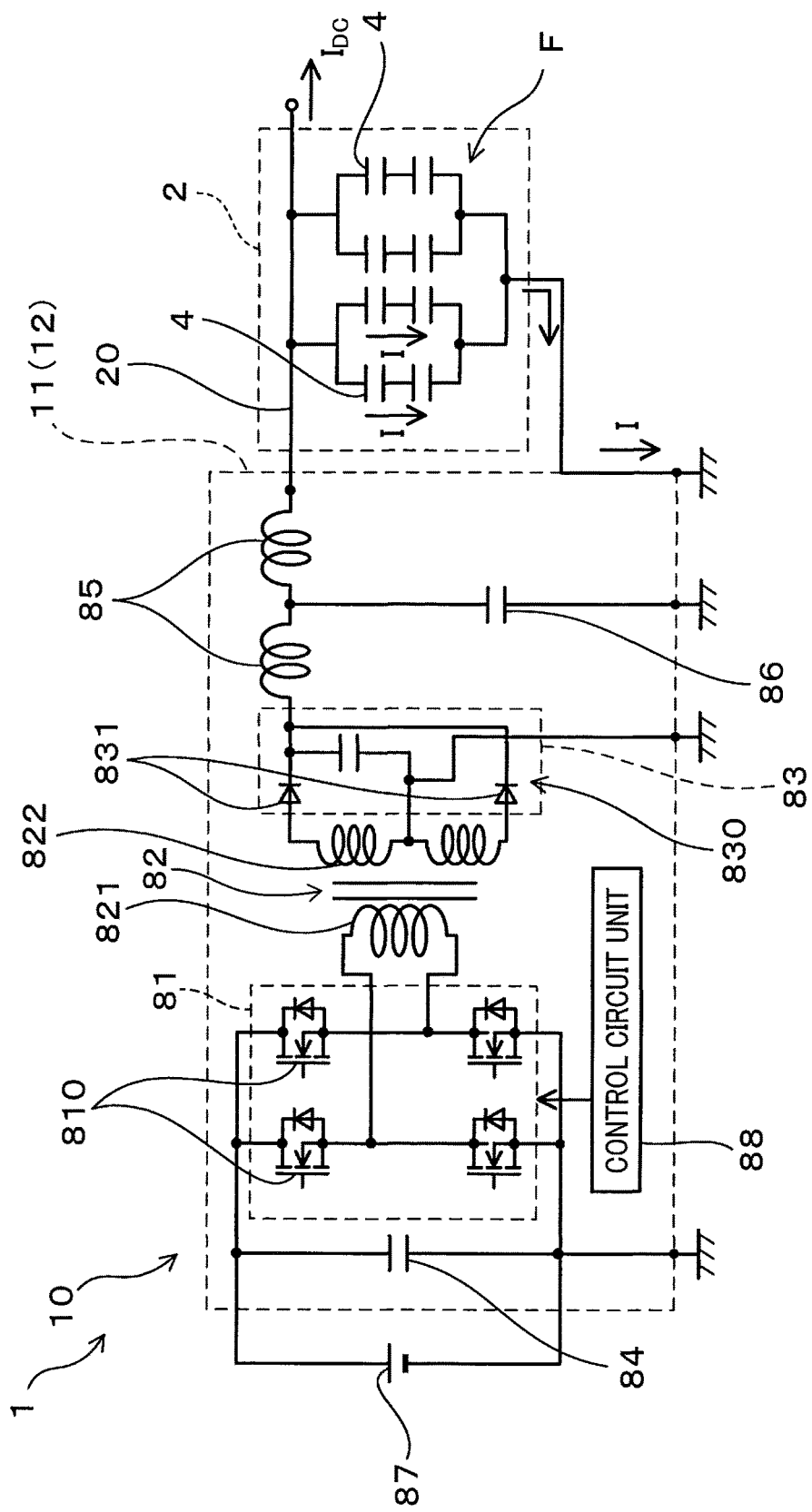
FIG. 6 is a circuit diagram of the electronic apparatus according to the first embodiment.

Next, the electronic apparatus main body 10 will be described. As shown in FIG. 6, the electronic apparatus main body 10 includes an input-side capacitor 84, a metal-oxide-semiconductor (MOS) module 81, a transistor 82, a diode module 83, a coil 85, an output-side capacitor 86, and a control circuit unit 88. These electronic components are housed inside the case 11 (see FIG. 2).

The input-side capacitor 84 removes a noise current included in direct-current power supplied from a high-voltage battery 87. The input-side capacitor 84 also smoothes the direct-current voltage. In addition, the MOS module 81 includes therein four metal-oxide-semiconductor field-effect transistors (MOSFETs) 810. The four MOSFETs 810 configure a bridge circuit. The control circuit unit 88 controls operation of the MOSFETs 810.

The MOS module 81 is connected to a primary coil 821 of the transistor 82. A secondary coil 822 of the transistor 82 is connected to the diode module 83. The diode module 83 is provided with a plurality of diodes 831. The plurality of diodes 831 configure a rectifier circuit 830. According to the present embodiment, the transistor 82 lowers the voltage applied to the primary coil 821 and the rectifier circuit 830 rectifies the voltage.

The output from the rectifier circuit 830 includes a noise current. The coil 85 and the output-side capacitor 86 therefore remove the noise current. However, the noise current is not sufficiently removed even through use of the coil 85 and the output-side capacitor 86. Therefore, according to the present embodiment, the filter circuit F including the capacitors 4 is formed inside the terminal block 2. The noise current I entering the external terminal 20 passes through the capacitor 4 and flows into the case wall 12 of the case 11. Thereafter, the noise current I returns to the noise generation source. As a result, the noise current I is removed from a direct current $I_{DC}$ outputted from the external terminal 20.

Next, working effects according to the present embodiment will be described. As shown in FIG. 1, according to the present embodiment, the elastic member 5 composed of a conductive material is disposed between the capacitors 4 and the external terminal 20. The elastic member 5 and the capacitors 4 form the filter circuit F that allows the noise current I included in the external terminal 20 to flow to the case wall 12.

Therefore, when stress is applied to the capacitors 4 from outside, the elastic member 5 can become elastically deformed and absorb the stress. Consequently, a large amount of stress is no longer easily applied to the capacitor 4. Cracks and the like are not easily formed in the capacitors 4. In addition, when the elastic member 5 is disposed, the capacitors 4 can be pressed against other conductive members, such as the waterproof cover 6, by the pressing force of the elastic member 5. Thus, excellent electrical connection between the capacitors 4 and the conductive members can be obtained.

As a result of the configuration according to the present embodiment being used, use of a printed board and soldering of the capacitors 4 to the printed board are no longer necessary. Therefore, manufacturing cost of the terminal block 2 can be reduced.

As a result of the configuration according to the present embodiment being used, the capacitors 4 can be fixed inside the terminal block 2 without use of a printed board. Therefore, the path of the noise current I can be shortened. Parasitic inductance occurring on the path of the noise current I can be reduced. Consequently, the effect of removing the noise current I can be improved.

Figure 13:
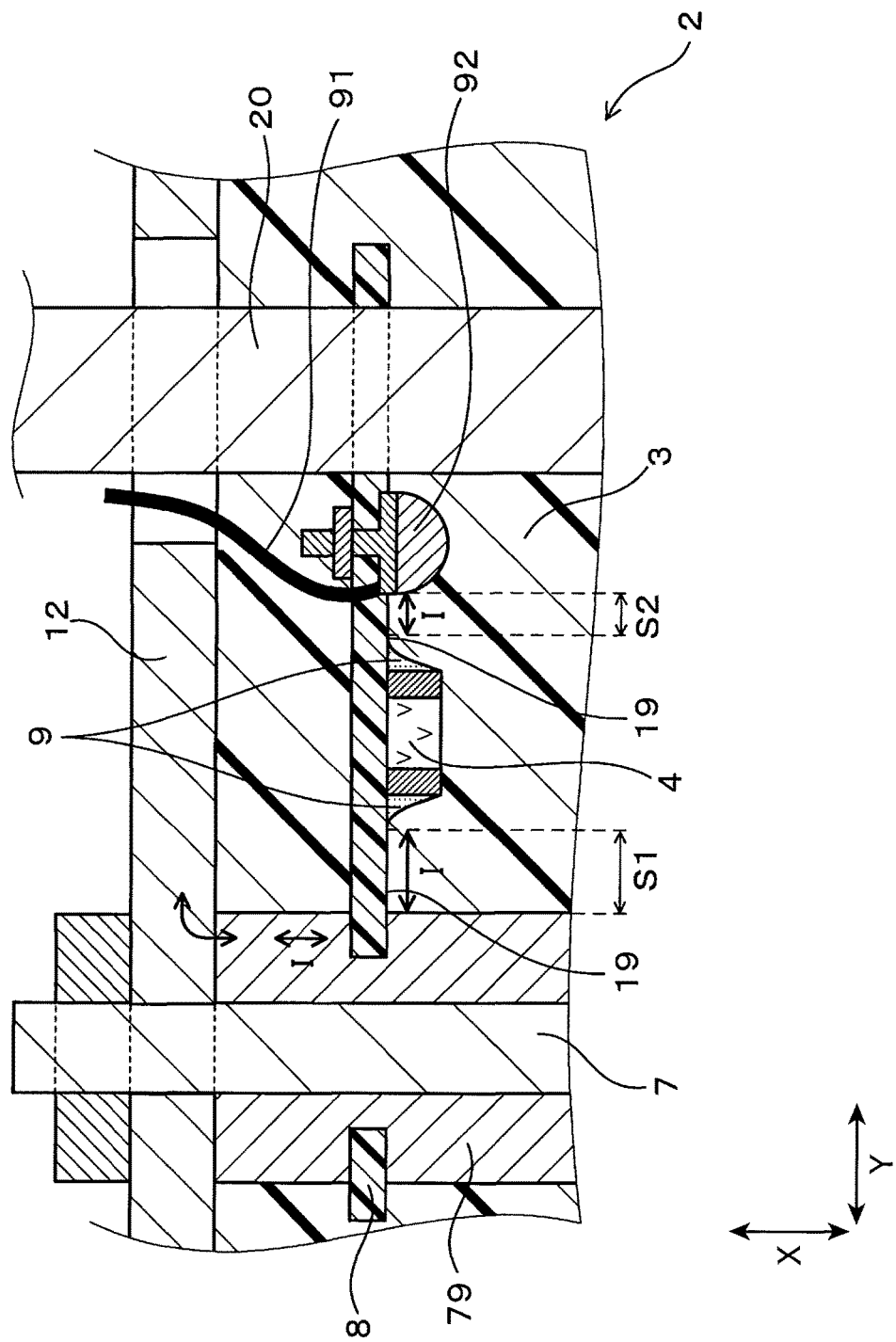
FIG. 13 is an enlarged cross-sectional view of a main section of a terminal block in a comparative example.

FIG. 13 shows a comparative example in the related art. In the comparative example, as shown in FIG. 13, the capacitor 4 is soldered to a printed board 8 on which a metal film 19 through which the noise current I flows is formed. The metal film 19 and the external terminal 20 are electrically connected using a lead wire 91. The metal film 19 and the case wall 12 are electrically connected using the male screw 7 and the collar 79. Thus, the path over which the noise current I flows tends to be long.

In particular, when the printed board 8 is used, the printed board 8 becomes warped as a result of the fastening force of the male screw 7. Stress is applied to the capacitor 4 and the solder 9, and cracks may form. Therefore, a space 51 for alleviating stress is required to be secured between solder 9 and the male screw 7. A space S2 for alleviating stress is also required to be secured between the solder 9 and a lead wire fastening member 92. As a result, the path of the noise current I tends to become long, and parasitic inductance easily occurs. Consequently, the noise removal effect cannot be sufficiently achieved.

Meanwhile, when the capacitors 4 are fixed using the elastic member 5 as according to the present embodiment, the printed board 8 is no longer required to be used. Therefore, problems such as those described above do not occur. Consequently, the path of the noise current I can be shortened, and the noise removal effect can be improved.

According to the present embodiment, the terminal block 2 is attached to the outer case surface 121 of the case wall 12. Thus, the capacitors 4 inside the terminal block 2 can be disposed on the outer side of the case 11. As a result, radiated noise that is generated from the electronic apparatus main body 10 inside the case 11 and transmitted to the capacitors 4 can be blocked by the case wall 12. Consequently, a noise current being newly generated as a result of the radiated noise interlinking with the capacitors 4 can be suppressed.

As shown in FIG. 1, in the electronic apparatus 1 according to the present embodiment, when viewed from the direction (X direction) in which the elastic force from the elastic member 5 is applied to the capacitors 4, the case wall 12, the capacitors 4, the elastic member 5, and the external terminal 20 are configured such as to overlap. The electrodes 41 of the capacitor 4 are formed on both ends of the capacitor 4 in the X direction.

Thus, the path of the noise current I can be further shortened. That is, as a result of the above-described configuration, one (41a) of the electrodes 41 of the capacitor 4 can be pressed against the case wall 12 by the elastic force from the elastic member 5. Therefore, the electrode 41a and the case wall 12 can be placed in close contact. In addition, the other electrode 41 (41b) of the capacitor 4 can be placed in close contact with the elastic member 5. Consequently, the path over which the noise current I flows from the external terminal 20 to the case wall 12 can be shortened. The noise removal effect can be further improved.

As shown in FIG. 1, the external terminal 20 according to the present embodiment includes the main terminal body 21 and the projecting portions 22. The projecting portions 22 project from the main terminal body 21 in the Y direction. The elastic force from the elastic member 5 is applied to the capacitors 4 in the above-described thickness direction (X direction). In addition, when viewed from the X direction, the case wall 12, the capacitors 4, the elastic member 5, and the projecting portions 22 are configured such as to overlap.

Consequently, removal efficiency for removing the noise current I can be further increased. That is, as a result of the above-described configuration, the direction of the noise current I (I1) flowing to the main terminal body 21 and the direction of the noise current I (I2) flowing from the projecting portions 22 to the case wall 12 can be set to opposite directions. As a result, magnetic fields formed in the peripheries of these noise currents I1 and I2 can be made to cancel out each other. Inductance can be further reduced. Consequently, the noise current I is more easily transmitted to the case wall 12.

According to the present embodiment, the capacitors 4 and the elastic member 5 are disposed in a position adjacent to the main terminal body 21. As a result, an area of a loop L through which the noise current I flows can be reduced. Therefore, an alternating field φ that is generated from the electronic apparatus main body 10 and leaks outside of the case 11 through the through-hole 13 does not pass through the loop L. As a result, an induced current, that is, a noise current being newly generated in the loop L because of the alternating field φ can be suppressed. Consequently, output of a noise current from the external terminal 20 can be more effectively suppressed.

As shown in FIG. 1, according to the present embodiment, the plurality of capacitors 4 are connected in series. Thus, reliability of the filter circuit F can be improved. That is, short-circuit failure of the capacitor 4 may occur as a result of stress applied from outside, over-voltage, and the like. Therefore, as a result of the plurality of capacitors 4 being connected in series, even should short-circuit failure occur in a single capacitor 4, short-circuit failure of the overall filter circuit 4 can be suppressed as long as the other capacitors 4 that are connected in series to the single capacitor 4 have not failed. Consequently, reliability of the filter circuit 4 can be improved.

According to the present embodiment, the electrodes 41 of the plurality of capacitors 4 that are connected in series are in contact with each other. Thus, the noise current I can be more effectively removed. That is, when the electrodes 41 of the capacitors 4 are placed in direct contact with each other, as according to the present embodiment, parasitic inductance does not easily occur between the electrodes 41, because a wire, solder, or the like is not interposed between the electrodes 41. Consequently, the noise current I easily flows to the case wall 12.

According to the present embodiment, the elastic member 5 is disposed. Thus, the capacitors 4 are pressed by the elastic force from the elastic member 5. Consequently, the electrodes 41 can be placed in contact with each other and electrically connected, without the use of solder or the like.

As shown in FIG. 1, according to the present embodiment, the electrically conductive waterproof cover 6 is disposed between the capacitors 4 and the case wall 12. Consequently, waterproofing of the capacitors 4 can be improved while ensuring electrical connection between the capacitors 4 and the case wall 12.

Furthermore, the collar 14 is disposed in the main body portion 3. The collar 14 receives the fastening force of the male screw 7. The extension portion 62 that extends from the waterproof cover 6 is interposed between the collar 14 and the case wall 12. Thus, excellent electrical connection between the extension portion 62 and the case wall 12 can be obtained by the fastening force of the male screw 7. Consequently, even should electrical connection between a portion 69 (see FIG. 1) of the waterproof cover 6 that overlaps with the capacitors 4 in the X direction and the case wall 12 be unfavorable, the noise current I can be favorably sent to the case wall 12 because the extension portion 62 is sufficiently electrically connected to the case wall 12.

Figure 12:
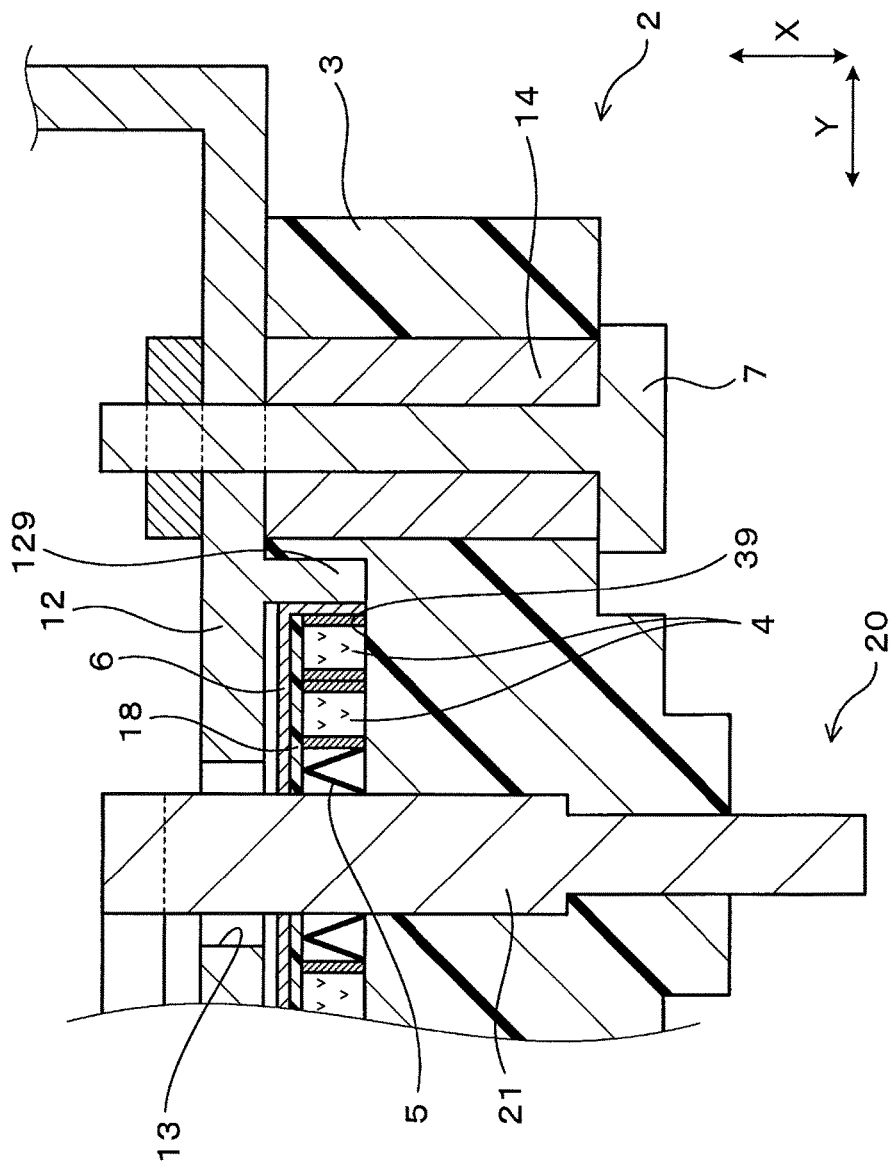
FIG. 12 is an enlarged cross-sectional view of a main section of a terminal block according to a fourth embodiment.

According to the present embodiment, the capacitors 4 and the elastic member 5 are housed inside the housing recess portion 39 such as to overlap in the X direction, as shown in FIG. 1. Therefore, assembly between the capacitors 4 and the elastic member 5 can be improved. That is, as shown in FIG. 12, the capacitors 4 and the elastic member 5 may be housed inside the housing recess portion 39 such as to overlap in the Y direction. However, in this case, the capacitors 4 may pop out of the housing recess portion 39 as a result of the elastic force from the elastic member 5, during the manufacturing process of the electronic apparatus 1. As a result, assembly of the capacitors 4 and the like may become poor. Meanwhile, should the capacitors 4 and the elastic member 5 be housed inside the housing recess portion 39 such as to overlap in the X direction, as according to the present embodiment shown in FIG. 1, such problems can be reduced and assembly can be improved.

As described above, according to the present embodiment, an electronic apparatus can be disposed in which stress applied to a capacitor inside a terminal block can be reduced, manufacturing cost can be reduced, and noise removal effect can be improved.

According to the present embodiment, the elastic member 5 is disposed between the capacitors 4 and the external terminal 20 (projecting portions 22). However, the present disclosure is not limited thereto. That is, as described hereafter, the elastic member 5 can be disposed between the capacitors 4 and the case wall 12. In addition, the elastic member 5 may be disposed both between the capacitors 4 and the case wall 12, and between the capacitors 4 and the external terminal 20. Furthermore, the elastic member 5 may be disposed between the capacitors 4 and the waterproof cover 6.

According to the present embodiment, the leaf spring is used as the elastic member 5. However, the present disclosure is not limited thereto. Another elastic member, such as a coil spring or a disk spring, can also be used.

According to the present embodiment, the terminal block 2 is attached to the outer case surface 121 of the case wall 12. However, the present disclosure is not limited thereto. The terminal block 2 may be attached to an inner case surface 122.

In the embodiments described below, reference numbers used in the drawings that are identical to those according to the first embodiment represent constituent elements similar to those according to the first embodiment, unless otherwise noted.

Second Embodiment

Figure 9:
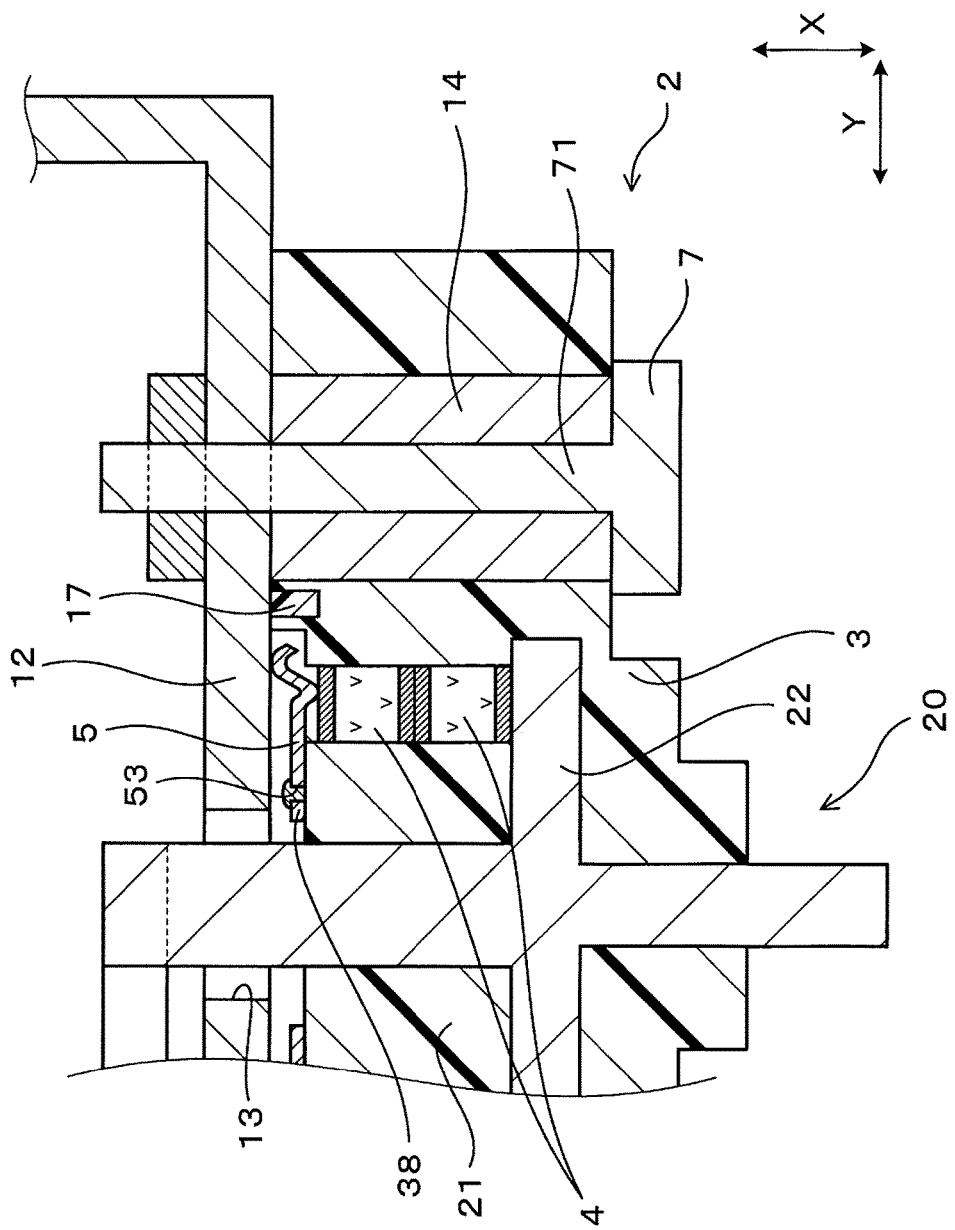
FIG. 9 is an enlarged cross-sectional view of a main section of the terminal block according to the second embodiment.

A second embodiment is an example in which the position of the elastic member 5 is changed. As shown in FIG. 9, according to the present embodiment, the elastic member 5 is disposed between the case wall 12 and the capacitors 4. The elastic member 5 is in direct contact with the case wall 12. That is, the waterproof cover 6 (see FIG. 1) and the like are not interposed between the elastic member 5 and the case wall 12. In addition, the elastic member 5 is also in contact with the capacitors 4.

Figure 10:
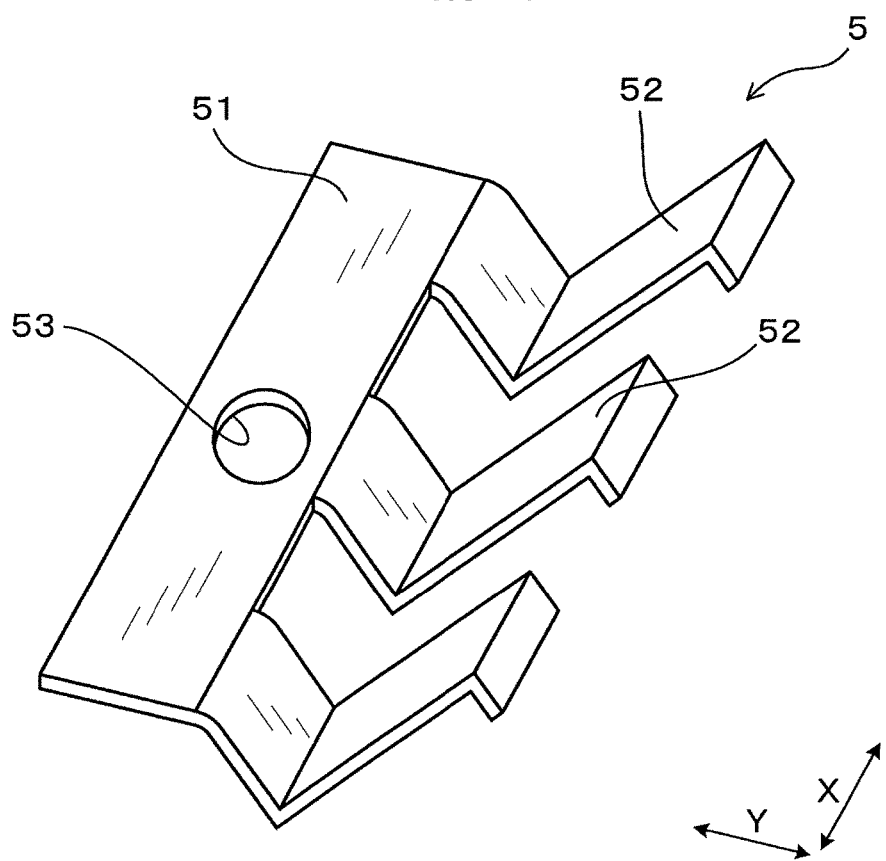
FIG. 10 is a perspective view of an elastic member according to the second embodiment.

As shown in FIG. 10, the elastic member 5 includes a plate-like portion 51 and a plurality of spring portions 52 that extend from the plate-like portion 51. The capacitors 4 are pressed in the X direction by the spring portions 52. In the plate-like portion 51, a hole portion 53 is formed. A columnar portion 38 is formed in the main body portion 3. The columnar portion 38 is inserted into the hole portion 53 and thermally caulked. As a result, the elastic member 5 is fixed to the main body portion 3.

Figure 8:
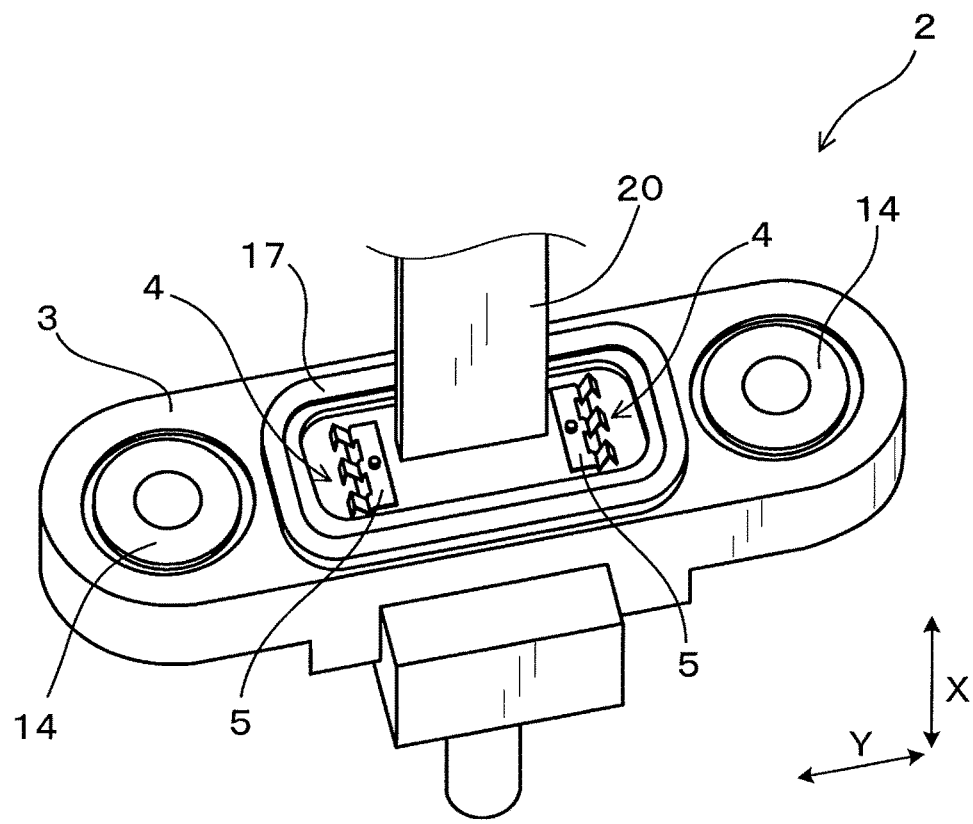
FIG. 8 is a perspective view of a terminal block according to a second embodiment.

As shown in FIGS. 8 and 9, according to the present embodiment, the capacitors 4 are disposed on the inner side of the sealing member 17. As a result, waterproofing of the capacitors 4 can be ensured without the capacitors 4 being provided with the waterproof cover 6 (see FIG. 1).

Working effects according to the present embodiment will be described. As shown in FIG. 9, according to the present embodiment, the elastic member 5 is interposed between the case wall 12 and the capacitors 4. The elastic member 5 is in contact with the case wall 12 and the capacitors 4.

Therefore, another component, such as the waterproof cover 6 (see FIG. 1), is not disposed between the capacitors 4 and the case wall 12. The distance from the projecting portions 22 to the case wall 12 can be shortened. As a result, the path over which the noise current I flows can be shortened, and parasitic inductance can be reduced. Consequently, the noise current I more easily flows to the case wall 12.

Other configurations and working effects similar to those according to the first embodiment are also achieved.

Third Embodiment

Figure 11:
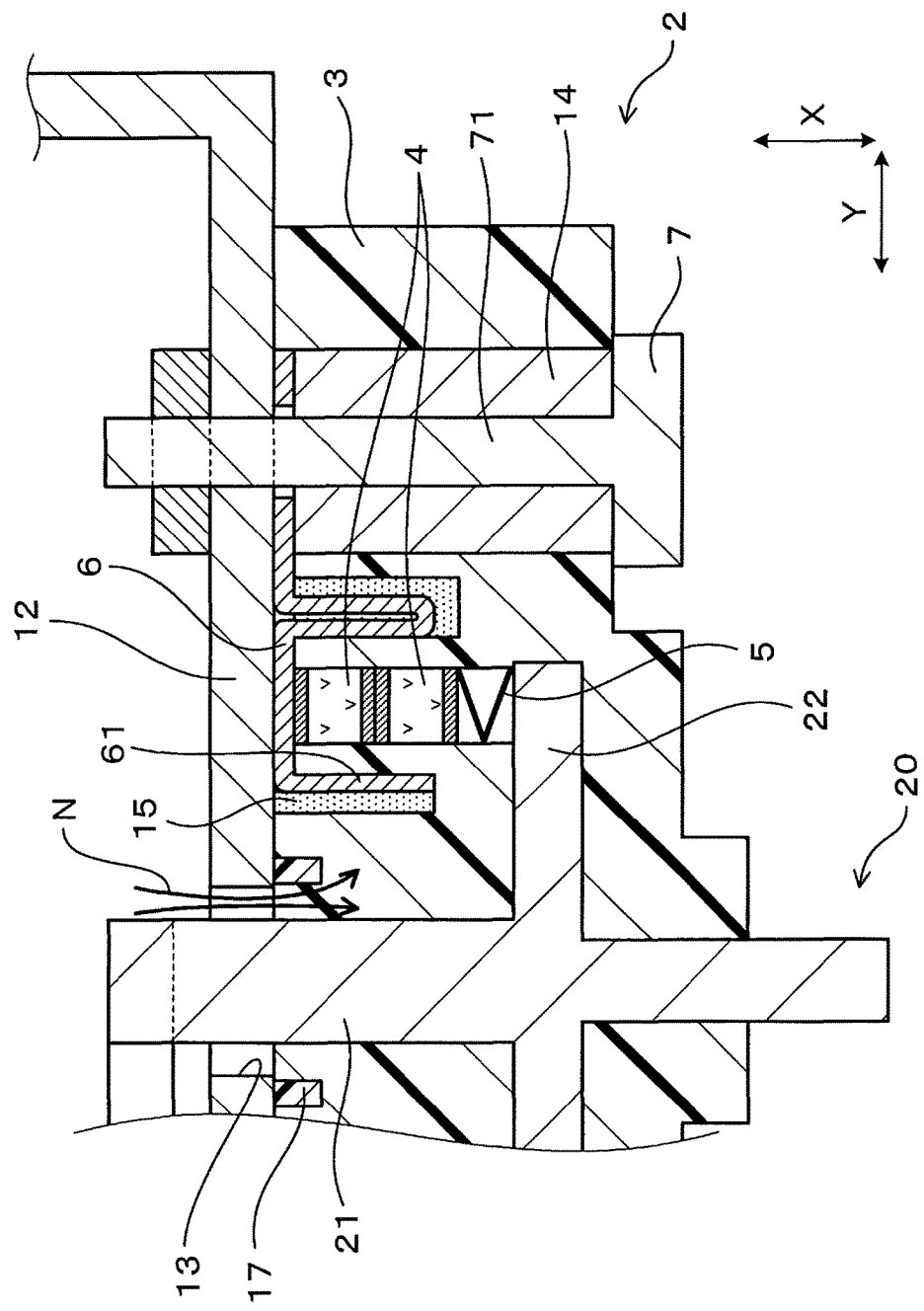
FIG. 11 is an enlarged cross-sectional view of a main section of a terminal block according a third embodiment.

A third embodiment is an example in which the shape of the waterproof cover 6 is changed. As shown in FIG. 11, a noise blocking wall 61 is formed in the waterproof cover 6 according to the present embodiment. The noise blocking wall 61 projects from the waterproof cover 6 in the X direction, and is interposed between the main terminal body 21 and the capacitors 4. The noise blocking wall 61 is composed of metal. As a result of the noise blocking wall 61, radiated noise N that is generated from the electronic apparatus main body 10 (see FIG. 2) and leaks outside of the case 11 from the through-hole 31 can be blocked.

Working effects according to the present embodiment will be described. As described above, according to the present embodiment, the noise blocking wall 61 is formed in the waterproof cover 6. Therefore, a noise current being newly generated in the capacitors 4 as a result of the radiated noise N interlinking with the capacitors 4 can be suppressed. Consequently, output of a noise current from the external terminal 20 can be more effectively suppressed.

Other configurations and working effects similar to those according to the first embodiment are also achieved.

Fourth Embodiment

A fourth embodiment is an example in which the shapes of the external terminal 20 and the case wall 12, and a positional relationship between the capacitors 4 and the elastic member 5 are changed.

As shown in FIG. 12, the external terminal 20 according to the present embodiment does not include the projecting portions 22 (see FIG. 1). In the case wall 12, a protrusion portion (or a ridge portion) 129 is formed. The protrusion portion 129 projects in the X direction. The elastic member 5 and the capacitors 4 are interposed between the protrusion portion 129 and the main terminal body 21. The elastic member 5 and the capacitors 4 overlap each other in the direction (Y direction) perpendicular to the X direction.

The present disclosure is not limited to the above-described embodiment and variation examples. The present disclosure can be actualized by various configurations without departing from the scope of the disclosure. For example, the technical features in the embodiment and variation examples corresponding to the technical features of each aspect described in the Summary can be exchanged or combined as appropriate to solve some or all of the above-described issues or to achieve some or all of the above-described effects. In addition, unless stated in the present specification as being an essential feature, the technical features can be omitted as appropriate.

What is claimed is:
1. An electronic apparatus comprising:
a case that houses an electronic apparatus main body and is electrically conductive; and
a terminal block that is attached to a case wall of the case, the terminal block including:
  a main body portion that is composed of an insulating material;
  an external terminal, that is partially covered by the main body portion, is inserted into a through-hole formed in the case wall, and is connected to the electronic apparatus main body;
  a capacitor that is disposed inside the main body portion; and
  an elastic member, that is disposed inside the main body portion, is composed of a conductive material, is interposed at least one of between the capacitor and the external terminal, and between the capacitor and the case wall, and fixes the capacitor inside the main body portion by pressing the capacitor, the capacitor and the elastic member configuring a filter circuit that allows a noise current included in the external terminal to flow to the case wall.

2. The electronic apparatus according to claim 1, wherein:
the terminal block is attached to an outer case surface of the case wall.

3. The electronic apparatus according to claim 2, wherein:
the case wall, the capacitor, the elastic member, and the external terminal overlap when viewed from a direction in which elastic force from the elastic member is applied to the capacitor; and
the capacitor has electrodes on both ends of the capacitor in the direction in which the elastic force is applied.

4. The electronic apparatus according to claim 3, wherein:
the external terminal includes
    a main terminal body that extends in a thickness direction of the case wall, and
    a projecting portion that projects from the main terminal body in a direction perpendicular to the thickness direction;
the elastic force from the elastic member is applied to the capacitor in the thickness direction; and
the case wall, the capacitor, the elastic member, and the projecting portion overlap when viewed from the thickness direction.

5. The electronic apparatus according to claim 4, wherein:
a waterproof cover that is electrically conductive is disposed between the capacitor and the case wall, and is configured such that the noise current flows through the waterproof cover.

6. The electronic apparatus according to claim 5, wherein:
the main body portion is fastened to the case wall by a male screw;
the main body portion is provided with a cylindrical collar that surrounds an axial portion of the male screw and receives a fastening force of the male screw;
an extension portion extends towards a side of the collar from the waterproof cover; and
the extension portion is interposed between the collar and the case wall.

7. The electronic apparatus according to claim 6, further comprising:
a noise blocking wall that projects from the waterproof cover in the thickness direction, is interposed between the main terminal body and the capacitor, and blocks radiated noise that leaks outside of the case from the through-hole.

8. The electronic apparatus according to claim 7, wherein:
the capacitor is configured by a plurality of capacitors that are connected in series, the respective capacitors having electrodes that are in contact with each other.

9. The electronic apparatus according to claim 3, wherein:
a waterproof cover that is electrically conductive is disposed between the capacitor and the case wall, and is configured such that the noise current flows through the waterproof cover.

10. The electronic apparatus according to claim 3, wherein:
the elastic member is interposed between the case wall and the capacitor, and is in contact with both the case wall and the capacitor.

11. The electronic apparatus according to claim 4, wherein:
the elastic member is interposed between the case wall and the capacitor, and is in contact with both the case wall and the capacitor.

12. The electronic apparatus according to claim 5, comprising:
a noise blocking wall, that projects from the waterproof cover in the thickness direction, is interposed between the main terminal body and the capacitor, and blocks radiated noise that leaks outside of the case from the through-hole.

13. The electronic apparatus according to claim 1, wherein:
the case wall, the capacitor, the elastic member, and the external terminal overlap when viewed from a direction in which elastic force from the elastic member is applied to the capacitor; and
the capacitor has electrodes on both ends of the capacitor in the direction in which the elastic force is applied.

14. The electronic apparatus according to claim 1, wherein:
the capacitor is configured by a plurality of capacitors that are connected in series, the respective capacitors having electrodes that are in contact with each other.

* * * * *